US009818820B2

(12) United States Patent
Yamazaki et al.

(10) Patent No.: US 9,818,820 B2
(45) Date of Patent: Nov. 14, 2017

(54) OXIDE MATERIAL AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Motoki Nakashima, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/140,535

(22) Filed: Apr. 28, 2016

(65) Prior Publication Data
US 2016/0240607 A1 Aug. 18, 2016

Related U.S. Application Data

(63) Continuation of application No. 13/444,132, filed on Apr. 11, 2012, now Pat. No. 9,331,206.

(30) Foreign Application Priority Data

Apr. 22, 2011 (JP) ................... 2011-096611

(51) Int. Cl.
*H01L 29/04* (2006.01)
*H01L 29/786* (2006.01)
(Continued)

(52) U.S. Cl.
CPC ...... *H01L 29/045* (2013.01); *H01L 21/02565* (2013.01); *H01L 21/02609* (2013.01);
(Continued)

(58) Field of Classification Search
CPC .......... H01L 29/7869; H01L 29/78696; H01L 29/78606; H01L 29/66969; H01L 29/24;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 1770788 A 4/2007
(Continued)

OTHER PUBLICATIONS

Fukumoto.E et al., "High Mobility Oxide Semiconductor TFT for Circuit Integration of AM-OLED", IDW '10 : Proceedings of the 16th International Display Workshops, Dec. 1, 2010, pp. 631-634.
(Continued)

*Primary Examiner* — Walter H Swanson
(74) *Attorney, Agent, or Firm* — Robinson Intellectual Property Law Office; Eric J. Robinson

(57) ABSTRACT

Stable electrical characteristics are given to a transistor and a highly reliable semiconductor device is provided. In addition, an oxide material which enables manufacture of such a semiconductor device is provided. An oxide film is used in which two or more kinds of crystalline portions which are different from each other in a direction of an a-axis or a direction of a b-axis in an a-b plane (or the top surface, or the formation surface) are included, and each of the crystalline portions is c-axis aligned, has at least one of triangular atomic arrangement and hexagonal atomic arrangement when seen from a direction perpendicular to the a-b plane, a top surface, or a formation surface, includes metal atoms arranged in a layered manner, or metal atoms and oxygen atoms arranged in a layered manner along the c-axis, and is expressed as $In_2SnZn_2O_7(ZnO)_m$ (m is 0 or a natural number).

18 Claims, 13 Drawing Sheets

(51) Int. Cl.
  *H01L 21/02* (2006.01)
  *H01L 27/105* (2006.01)
  *H01L 27/12* (2006.01)
  *H01L 29/24* (2006.01)
  *H01L 29/66* (2006.01)
  *H01L 29/788* (2006.01)

(52) U.S. Cl.
  CPC ........ *H01L 27/1052* (2013.01); *H01L 27/124* (2013.01); *H01L 27/1225* (2013.01); *H01L 27/1255* (2013.01); *H01L 29/24* (2013.01); *H01L 29/66969* (2013.01); *H01L 29/788* (2013.01); *H01L 29/7869* (2013.01); *H01L 29/78606* (2013.01); *H01L 29/78696* (2013.01)

(58) Field of Classification Search
  CPC . H01L 29/045; H01L 27/1255; H01L 27/124; H01L 27/1225; H01L 27/1052; H01L 21/02609; H01L 21/02565; H01L 29/788; H01L 29/242; H01L 2924/1067
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,906,780 B2 | 3/2011 | Iwasaki |
| 7,910,490 B2 | 3/2011 | Akimoto et al. |
| 7,932,521 B2 | 4/2011 | Akimoto et al. |
| 7,964,871 B2 | 6/2011 | Iwasaki |
| 8,003,981 B2 | 8/2011 | Iwasaki et al. |
| 8,202,365 B2 | 6/2012 | Umeda et al. |
| 8,232,552 B2 | 7/2012 | Yano et al. |
| 8,268,666 B2 | 9/2012 | Abe et al. |
| 8,314,420 B2 | 11/2012 | Hoffman et al. |
| 8,319,218 B2 | 11/2012 | Yamazaki et al. |
| 8,367,489 B2 | 2/2013 | Yamazaki |
| 8,384,085 B2 | 2/2013 | Kimura et al. |
| 8,492,761 B2 | 7/2013 | Abe et al. |
| 8,669,556 B2 | 3/2014 | Yamazaki et al. |
| 8,716,711 B2 | 5/2014 | Iwasaki |
| 8,753,548 B2 | 6/2014 | Yano et al. |
| 8,765,522 B2 | 7/2014 | Yamazaki |
| 8,772,768 B2 | 7/2014 | Yamazaki |
| 8,871,119 B2 | 10/2014 | Yano et al. |
| 8,912,541 B2 | 12/2014 | Yamazaki et al. |
| 9,306,072 B2 | 4/2016 | Yamazaki et al. |
| 9,331,206 B2 | 5/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0199961 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278120 A1 | 11/2009 | Lee et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0127256 A1* | 5/2010 | Inoue ................ C01G 9/02 257/43 |
| 2010/0136743 A1 | 6/2010 | Akimoto et al. |
| 2010/0155716 A1 | 6/2010 | Cheong et al. |

(56) References Cited

U.S. PATENT DOCUMENTS

| | | | |
|---|---|---|---|
| 2010/0155717 A1* | 6/2010 | Yano | C23C 14/086 257/43 |
| 2011/0062436 A1 | 3/2011 | Yamazaki et al. | |
| 2011/0068335 A1 | 3/2011 | Yamazaki et al. | |
| 2011/0084264 A1 | 4/2011 | Yamazaki et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0128275 A1 | 6/2011 | Ueda et al. | |
| 2011/0163311 A1 | 7/2011 | Akimoto et al. | |
| 2011/0210328 A1 | 9/2011 | Yamazaki et al. | |
| 2011/0212571 A1 | 9/2011 | Yamazaki et al. | |
| 2011/0215318 A1 | 9/2011 | Yamazaki et al. | |
| 2011/0215319 A1 | 9/2011 | Yamazaki et al. | |
| 2011/0240988 A1 | 10/2011 | Yano et al. | |
| 2011/0250713 A1* | 10/2011 | Kawasaki | H01L 29/458 438/34 |
| 2011/0256684 A1 | 10/2011 | Iwasaki et al. | |
| 2012/0032161 A1 | 2/2012 | Matsubayashi | |
| 2012/0032162 A1 | 2/2012 | Matsubayashi | |
| 2012/0132907 A1 | 5/2012 | Yamazaki et al. | |
| 2012/0153364 A1 | 6/2012 | Yamazaki et al. | |
| 2012/0161121 A1 | 6/2012 | Yamazaki | |
| 2012/0164766 A1 | 6/2012 | Yeh et al. | |
| 2012/0256179 A1 | 10/2012 | Yamazaki et al. | |

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2273540 A | 1/2011 |
| EP | 2544237 A | 1/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 A | 10/2003 |
| JP | 2004-103957 A | 4/2004 |
| JP | 2004-273614 A | 9/2004 |
| JP | 2004-273732 A | 9/2004 |
| JP | 2007-073703 A | 3/2007 |
| JP | 2007-096055 A | 4/2007 |
| JP | 2007-123861 A | 5/2007 |
| JP | 2007-201366 A | 8/2007 |
| JP | 2007-250983 A | 9/2007 |
| JP | 2008-243928 A | 10/2008 |
| JP | 2009-167087 A | 7/2009 |
| JP | 2010-074148 A | 4/2010 |
| JP | 2010-165922 A | 7/2010 |
| JP | 2011-035376 A | 2/2011 |
| JP | 2011-054942 A | 3/2011 |
| JP | 2011-054946 A | 3/2011 |
| JP | 2011-086923 A | 4/2011 |
| JP | 2011-100979 A | 5/2011 |
| JP | 2012-232889 A | 11/2012 |
| TW | 200534370 | 10/2005 |
| WO | WO-2004/114391 | 12/2004 |
| WO | WO-2005/093846 | 10/2005 |
| WO | WO-2007/086291 | 8/2007 |
| WO | WO-2007/119386 | 10/2007 |
| WO | WO-2010/021349 | 2/2010 |
| WO | WO-2010/023889 | 3/2010 |
| WO | WO-2010/067571 | 6/2010 |
| WO | WO-2011/033936 | 3/2011 |
| WO | WO-2011/043176 | 4/2011 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005; pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, and 16) in the $In_2O_3$—$ZnGaO_4$—ZnO Sysytem", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M= In,Ga; m= Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-525, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09: SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-film Transisors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phase for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 ; SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Taiwanese Office Action (Application No. 101113604) dated Apr. 18, 2016.

* cited by examiner

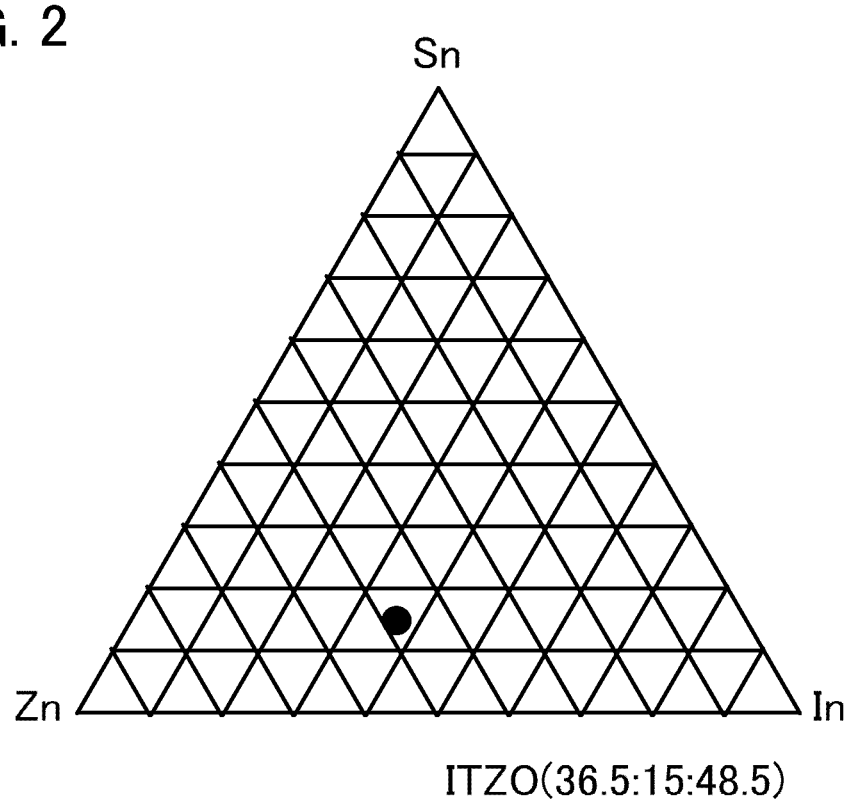

OXIDE MATERIAL AND SEMICONDUCTOR DEVICE

BACKGROUND OF THE INVENTION

1. Field of the Invention

The present invention relates to an oxide material, a semiconductor device including a semiconductor element such as a transistor which uses the oxide material, and a manufacturing method of the semiconductor device. For example, the present invention relates to a power device which is mounted on a power supply circuit; a semiconductor integrated circuit including a memory, a thyristor, a converter, an image sensor, or the like; an electro-optical device typified by a liquid crystal display panel; a light-emitting display device including a light-emitting element; and an electronic device including any of the above as a component.

In this specification, a semiconductor device generally refers to a device which can function by utilizing semiconductor characteristics; an electro-optical device, a light-emitting display device, and an electronic device are all included in the category of the semiconductor device.

2. Description of the Related Art

Many transistors formed over a glass substrate or the like are manufactured using amorphous silicon, polycrystalline silicon, or the like, as typically seen in liquid crystal display devices. Although a transistor manufactured using amorphous silicon has low field-effect mobility, it can be formed over a larger glass substrate. On the other hand, although a transistor manufactured using polycrystalline silicon has high field-effect mobility, it is not suitable for being formed over a larger glass substrate.

In recent years, a technique in which transistors are manufactured using an oxide semiconductor and applied to electronic devices or optical devices has attracted attention. A technique in which a transistor is manufactured using zinc oxide or an In—Ga—Zn—O-based oxide, for example, as an oxide semiconductor and used for a switching element of a pixel of a display device or the like is disclosed in Patent Document 1 and Patent Document 2.

REFERENCE

Patent Document

[Patent Document 1] Japanese Published Patent Application No. 2007-123861

[Patent Document 2] Japanese Published Patent Application No. 2007-096055

SUMMARY OF THE INVENTION

Electrical characteristics of a transistor using an oxide semiconductor film are easily affected by an electron state at an interface between the oxide semiconductor film and an insulating film in contact with the oxide semiconductor film. Thus, in the case where the oxide semiconductor film in contact with the insulating film is in an amorphous state during or after manufacture of a transistor, the density of defect states at the interface between the insulating film and the oxide semiconductor film is high and the transistor is likely to be electrically unstable.

Further, there is a problem in that electrical characteristics of a transistor in which an oxide semiconductor film is used are changed by irradiation with visible light or ultraviolet light, which leads a reduction in reliability.

In view of the above problems, it is an object of one embodiment of the present invention to give stable electrical characteristics to a transistor and to provide a highly reliable semiconductor device. In addition, it is another object of one embodiment of the present invention to provide an oxide material which enables manufacture of such a semiconductor device.

One embodiment of the present invention is an oxide material which includes two or more kinds of crystalline portions which are different from each other in a direction of an a-axis or a direction of a b-axis, and each of the crystalline portions is c-axis aligned and has at least one of triangular atomic arrangement and hexagonal atomic arrangement when seen from a direction perpendicular to the a-b plane, a top surface, or a formation surface.

An oxide material according to one embodiment of the present invention contains zinc. When zinc is contained, it becomes easy to form an oxide material which includes two or more kinds of crystalline portions which are different from each other in a direction of an a-axis or a direction of a b-axis, and each of the crystalline portions is c-axis aligned and has at least one of triangular atomic arrangement and hexagonal atomic arrangement when seen from a direction perpendicular to the a-b plane, a top surface, or a formation surface.

An oxide material according to one embodiment of the present invention contains two or more kinds of elements selected from indium, gallium, zinc, tin, titanium, and aluminum.

An oxide material according to one embodiment of the present invention can be formed by a sputtering method, an evaporation method, a plasma chemical vapor deposition (PCVD) method, a pulsed laser deposition (PLD) method, an atomic layer deposition (ALD) method, a molecular beam epitaxy (MBE) method, or the like.

An oxide material according to one embodiment of the present invention can be formed in such a manner that two kinds of films whose compositions are different from each other are stacked and then crystallized by heat treatment. Under some deposition conditions of the oxide material, crystallization may occur without heat treatment after stacking of the films.

One embodiment of the present invention is an oxide material including a plurality of metal layers or a plurality of metal oxide layers. The plurality of metal layers or the plurality of metal oxide layers are bonded through tetracoordinate oxygen (hereinafter referred to as tetracoordinate O) atoms. The plurality of metal layers or the plurality of metal oxide layers include a tetracoordinate central metal atom, a pentacoordinate central metal atom, and a central metal atom that can have either five ligands or six ligands.

In the case where the oxide material according to one embodiment of the present invention has conductivity, the oxide material can be used for a material of a gate electrode of a transistor. Note that the gate electrode may have a stacked-layer structure of a film of the oxide material according to one embodiment of the present invention and a metal film.

In the case where the oxide material according to one embodiment of the present invention has conductivity, the oxide material can be used for materials of a source electrode and a drain electrode of a transistor. Note that the source electrode and the drain electrode may each have a stacked-layer structure of a film of the oxide material according to one embodiment of the present invention and a metal film.

When an oxide material according to one embodiment of the present invention has a semiconductor property, a film containing the oxide material according to one embodiment of the present invention can be used for a channel formation region of a transistor. In that case, the film containing the oxide material is, for example, provided between and in contact with conductive films functioning as a source electrode and a drain electrode and an insulating film in the transistor. Note that the insulating film functions as a gate insulating film, a base insulating film, or an interlayer insulating film in the transistor.

According to one embodiment of the present invention, stable electrical characteristics can be given to a transistor and a highly reliable semiconductor device can be provided. Moreover, an oxide material which enables manufacture of such a semiconductor device can be provided.

BRIEF DESCRIPTION OF THE DRAWINGS

In the accompanying drawings:

FIG. 2 illustrates a composition ratio of an oxide material according to one embodiment of the present invention;

DETAILED DESCRIPTION OF THE INVENTION

Figure 1A:
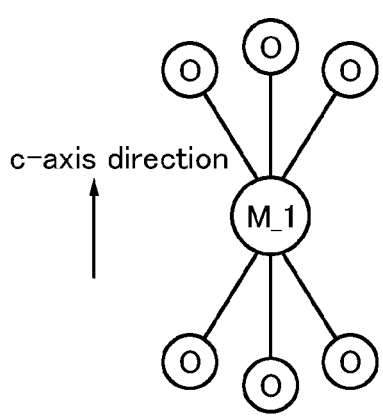
FIGS. 1A to 1D each illustrate a structure of an oxide material according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways. Further, the present invention is not construed as being limited to the description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. When one of a source and a drain of a transistor is called a drain, the other is called a source. That is, they are not distinguished depending on the potential level. Therefore, a portion called a source in this specification can be alternatively referred to as a drain.

A voltage refers to a potential difference between a given potential and a reference potential (e.g., a ground potential (GND) or a source potential) in many cases. Accordingly, a voltage can also be called a potential and vice versa.

Even when the expression "to be connected" is used in this specification, there is a case in which no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the invention.

Embodiment 1

In this embodiment, an oxide (c-axis aligned crystalline (CAAC) oxide) material will be described in which two or more kinds of crystalline portions which are different from each other in a direction of an a-axis or a direction of a b-axis in the a-b plane (or the top surface, or the formation surface) are included, and each of the crystalline portions is c-axis aligned, has at least one of triangular atomic arrangement and hexagonal atomic arrangement when seen from a direction perpendicular to the a-b plane, a top surface, or a formation surface, and includes metal atoms arranged in a layered manner, or metal atoms and oxygen atoms arranged in a layered manner along the c-axis.

In a broad sense, a CAAC oxide means a non-single-crystal material including a phase which has triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis.

A CAAC oxide is not single crystal and is not composed of only an amorphous component. Although the CAAC oxide includes a crystallized portion (crystalline portion), a boundary between one crystalline portion and another crystalline portion is not clear from an observation image obtained with a transmission electron microscope (TEM).

Nitrogen may be substituted for part of oxygen included in the CAAC oxide. The c-axes of individual crystalline portions of the CAAC oxide may be aligned in a certain direction (e.g., a direction perpendicular to a top surface or a formation surface). Alternatively, the normals of the a-b planes of the individual crystalline portions of the CAAC oxide may be aligned in a certain direction (e.g., a direction perpendicular to a top surface or a formation surface).

The CAAC oxide becomes a conductor, a semiconductor, or an insulator depending on its composition or the like. The CAAC oxide transmits or does not transmit visible light depending on its composition or the like.

An example of a CAAC oxide is a material which is formed into a film shape and has triangular or hexagonal atomic arrangement when observed from the direction perpendicular to a top surface or a formation surface and in which metal atoms are arranged in a layered manner or metal atoms and oxygen atoms (or nitrogen atoms) are arranged in a layered manner when a cross section of the film is observed.

The crystalline portion included in the CAAC oxide will be described in detail with reference to FIGS. 1A to 1D. In FIGS. 1A to 1D, the vertical direction corresponds to the c-axis direction and a plane perpendicular to the c-axis corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Further, in FIGS. 1A to 1C, O surrounded by a circle represents tetracoordinate O and O surrounded by a double circle represents tricoordinate O.

FIG. 1A illustrates a structure having one hexacoordinate metal atom M_1 and six tetracoordinate O atoms proximate to the metal atom M_1. Such a structure in which one metal atom and proximate oxygen atoms to the metal atom are only illustrated is called a small group here. The structure in FIG. 1A is actually an octahedral structure, but is illustrated as a planar structure for simplicity. Note that three tetracoordinate O atoms exist in each of an upper half and a lower half in FIG. 1A.

Figure 1B:
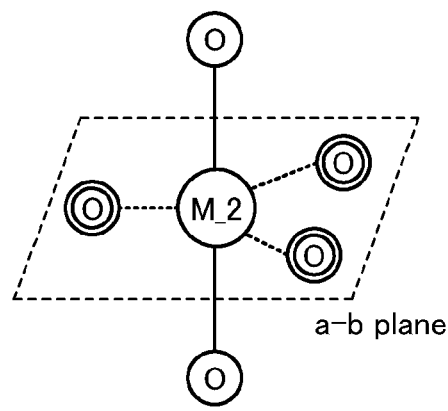

FIG. 1B illustrates a structure having one pentacoordinate metal atom M_2, three tricoordinate oxygen (hereinafter referred to as tricoordinate O) atoms proximate to the metal atom M_2, and two tetracoordinate O atoms proximate to the metal atom M_2. All the tricoordinate O atoms exist on the a-b plane. One tetracoordinate O atom exists in each of an upper half and a lower half in FIG. 1B.

Figure 1C:
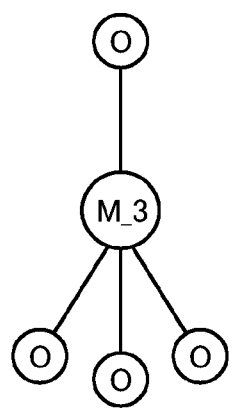

FIG. 1C illustrates a structure having one tetracoordinate metal atom M_3 and four tetracoordinate O atoms proximate to the metal atom M_3. In FIG. 1C, one tetracoordinate O atom exists in an upper half and three tetracoordinate O atoms exist in a lower half.

Metal atoms each of which has a coordination number of 4, 5, or 6 are bonded through a tetracoordinate O atom. Specifically, a metal atom is bonded to another metal atom through tetracoordinate O atoms when the number of tetracoordinate O atoms is four in total. For example, in the case where the hexacoordinate metal atom M_1 is bonded through three tetracoordinate O atoms in the upper half, it is bonded to the pentacoordinate metal atom M_2 through the teteracoordinate O atom in the upper half of the pentacoordinate metal atom M_2, the pentacoordinate metal atom M_2 through the teteracoordinate O atom in the lower half of the pentacoordinate metal atom M_2, or the tetracoordinate metal atom M_3 through the tetracoordinate O atom in the upper half of the tetracoordinate metal atom M_3.

Metal atoms each of which has any of the above coordination numbers are bonded through tetracoordinate O atoms. Further, one group is formed by combining small groups so that the total electric charge of a layered structure is 0. Note that a plurality of small groups form one group.

Figure 1D:
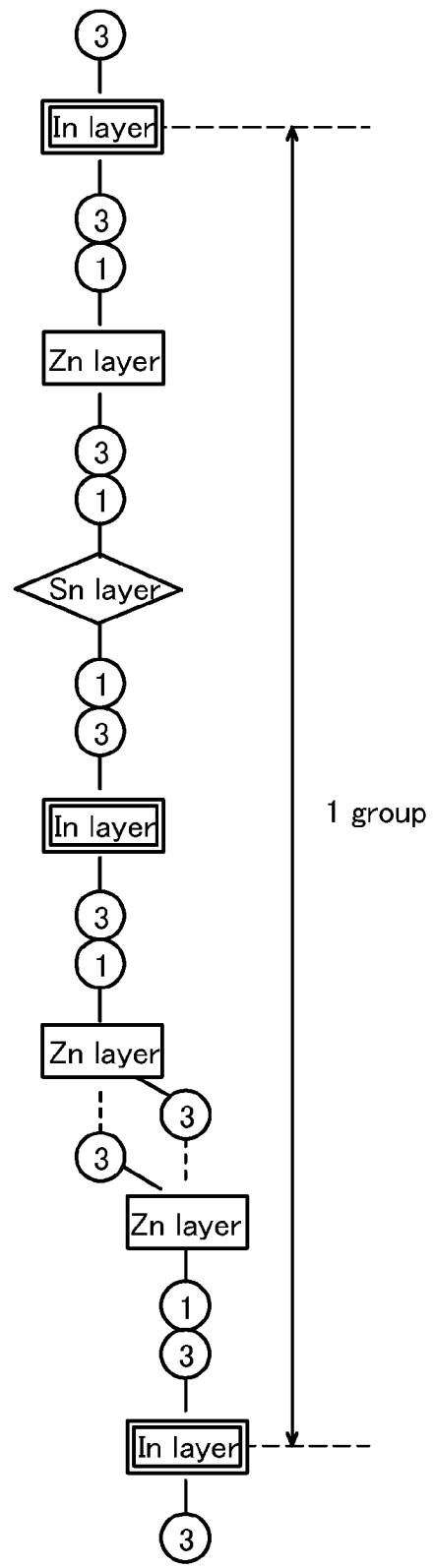

FIG. 1D illustrates a model of one group constituting a layered structure of an In—Sn—Zn—O-based material.

In FIG. 1D, for simplicity, a tricoordinate O atom is omitted and a tetracoordinate O atom is illustrated by a circle; the number in the circle shows the number of tetracoordinate O atoms. For example, three tetracoordinate O atoms existing in each of an upper half and a lower half with respect to an In atom are denoted by circled 3. Similarly, in FIG. 1D, one tetracoordinate O atom existing in each of an upper half and a lower half with respect to a Sn atom is denoted by circled 1. In a similar manner, FIG. 1D also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the one group constituting the layered structure of the In—Sn—Zn—O-based material in FIG. 1D, in the order starting from the top, an In atom proximate to three tetracoordinate O atoms in each of an upper half and a lower half is bonded to a Zn atom proximate to one tetracoordinate O atom in an upper half, the Zn atom is bonded to a Sn atom proximate to one tetracoordinate O atom in an upper half through three tetracoordinate O atoms in a lower half with respect to the Zn atom, and the Sn atom is bonded to an In atom proximate to three tetracoordinate O atoms in each of an upper half and a lower half through one tetracoordinate O atom in a lower half with respect to the Sn atom, the In atom is bonded to a Zn atom proximate to one tetracoordinate O atom in an upper half, the Zn atom is bonded to a Zn atom through three tetracoordinate O atoms in a lower half with respect to the Zn atom, and the Zn atom is bonded to an In atom through one tetracoordinate O atom in a lower half with respect to the Zn atom. This one group is bonded to another one group, whereby one unit that is one cycle is formed.

Here, electric charge of a tricoordinate O atom for making one bond and electric charge of a tetracoordinate O atom for making one bond can be assumed to be −0.667 and −0.5, respectively. For example, electric charge of (hexacoordinate or pentacoordinate) In, electric charge of (tetracoordinate) Zn, and electric charge of (pentacoordinate or hexacoordinate) Sn are +3, +2, and +4, respectively. Thus, electric charge of a small group including Sn is +1. Therefore, electric charge of −1, which cancels +1, is needed to form a layered structure including Sn. As a structure having electric charge of −1, a structure in which two small groups including Zn are bonded as in FIG. 1D can be given. For example, when one small group including Sn is combined with one structure in which two small groups including Zn are bonded, electric charge is canceled, whereby the total electric charge in the layered structure can be 0.

Further, an In atom can have either five ligands or six ligands. When a structure in which the one group illustrated in FIG. 1D is repeated is formed, In—Sn—Zn—O-based crystal ($In_2SnZn_3O_8$) can be obtained. Note that a layered structure of the In—Sn—Zn—O-based crystal which is obtained can be expressed as a composition formula, $In_2SnZn_2O_7(ZnO)_m$ (m is 0 or a natural number). As larger m is, the crystallinity of the In—Sn—Zn—O-based crystal is improved, which is preferable.

The above-described rule applies to the following oxide semiconductor: an In—Sn—Ga—Zn—O-based oxide semiconductor, an In—Ga—Zn—O-based oxide semiconductor (also referred to as IGZO), an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, and the like.

Next, a method for forming a CAAC oxide film is described.

First, a first oxide film is formed over a flat substrate by a sputtering method, an evaporation method, a PCVD method, a PLD method, an ALD method, an MBE method, or the like. Note that by heating the substrate at the time of film formation, an oxide film in which the ratio of crystalline portions to amorphous portions is high can be obtained. For example, the substrate temperature is higher than or equal to 150° C. and lower than or equal to 450° C., preferably higher than or equal to 200° C. and lower than or equal to 350° C.

By increasing the substrate temperature at the time of film formation, a CAAC oxide film in which the ratio of crystalline portions to amorphous portions is higher can be formed.

Next, the substrate may be subjected to first heat treatment. With the first heat treatment, the ratio of the crystalline portions to the amorphous portions in the oxide film can be further increased. The first heat treatment may be performed at a temperature, for example, higher than or equal to 200° C. and lower than the strain point of the substrate, and is preferably performed at a temperature higher than or equal to 250° C. and lower than or equal to 450° C. The first heat treatment is performed in an oxidizing atmosphere, an inert atmosphere, or a reduced-pressure atmosphere (10 Pa or lower), but the atmosphere is not limited thereto. The treatment time is 3 minutes to 24 hours. As the treatment time is prolonged, the ratio of the crystalline portions to the amorphous portions in the oxide film can be increased. However, heat treatment for over 24 hours is not excluded but not preferable because the productivity is reduced.

The oxidizing atmosphere is an atmosphere containing an oxidizing gas. The oxidizing gas is oxygen, ozone, nitrous oxide, or the like, and it is preferable that the oxidation gas do not contain water, hydrogen, and the like. For example, the purity of oxygen, ozone, or nitrous oxide to be introduced into a heat treatment apparatus is greater than or equal to 8N (99.999999%), preferably greater than or equal to 9N (99.9999999%) (the impurity concentration is lower than or equal to 10 ppb, preferably lower than 0.1 ppb). As the oxidizing atmosphere, an oxidizing gas and an inert gas may be mixed to be used. In that case, the mixture contains an oxidizing gas at a concentration of higher than or equal to 10 ppm.

Here, an inert atmosphere refers to an atmosphere containing an inert gas (such as nitrogen or a rare gas (e.g., helium, neon, argon, krypton, or xenon)) as the main component. Specifically, the concentration of a reactive gas such as an oxidizing gas is lower than 10 ppm.

For the first heat treatment, a rapid thermal anneal (RTA) apparatus can be used. With the use of the RTA apparatus, only in a short time, the heat treatment can be performed at a temperature higher than or equal to the strain point of the substrate. Thus, the time required for formation of the oxide film in which the ratio of crystalline portions to amorphous portions is high can be shortened.

Next, a second oxide film may be formed over the first oxide film, whereby an oxide stack may be formed. The second oxide film can be formed by a method selected from the methods for the first oxide film.

When the substrate is heated while the second oxide film is formed, the second oxide film can be crystallized with the use of the first oxide film as a seed crystal. At this time, to compose the first oxide film and the second oxide film using the same kind of element is referred to as "homo-growth." Alternatively, to compose the first oxide film and the second oxide film using elements, at least one kind of which differs between the first oxide film and the second oxide film, is referred to as "hetero-growth."

Note that second heat treatment may be performed after the second oxide film is formed. The second heat treatment may be performed in a manner similar to that of the first heat treatment. With the second heat treatment, an oxide stack in which the ratio of crystalline portions to amorphous portions is high can be obtained. Further, with the second heat treatment, the second oxide film can be crystallized with the use of the first oxide film as a seed crystal. At this time, homo-growth in which the first oxide film and the second oxide film are composed of the same kind of element may be caused. Alternatively, hetero-growth in which the first oxide film and the second oxide film are composed of elements, at least one kind of which differs between the first oxide film and the second oxide film, may be caused.

Through the above steps, a CAAC oxide film can be formed.

Here, an In—Sn—Zn—O-based material can have a composition ratio illustrated in FIG. 2. An In—Sn—Zn—O-based material typically has a composition ratio of In:Sn:Zn=2:1:3 [atomic ratio], In:Sn:Zn=2:1:4 [atomic ratio], or the like and a composition ratio which is close thereto is preferable. For example, In:Sn:Zn=36.5:15:48.5 [atomic ratio] illustrated in FIG. 2 can be employed. Further, in the case where an In—Sn—Zn—O-based oxide film is formed by a sputtering method using an In—Sn—Zn—O-based material as a target, a target whose Zn content is higher as compared to a desired composition ratio is used because Zn easily evaporates to be lost. For example, Zn is preferably contained at 50 atomic % or more. Note that when an oxide expressed by a composition formula of $In_aSn_bZn_cO_x$ has a composition ratio close to $In_2SnZn_4O_x$, a, b, and c satisfy the following two equations: $a+b+c=7$ and $(a-2)^2+(b-1)^2+(c-4)^2 \leq 0.25$.

Note that electrical characteristics of a transistor which uses an amorphous In—Sn—Zn—O-based oxide in a channel formation region have been reported, where a field-effect mobility of 30 $cm^2/Vs$ has been achieved (Eri Fukumoto, Toshiaki Arai, Narihiro Morosawa, Kazuhiko Tokunaga, Yasuhiro Terai, Takashige Fujimori, and Tatsuya Sasaoka, "High Mobility Oxide Semiconductor TFT for Circuit Integration of AM-OLED", IDW'10, pp. 631-634).

This embodiment can be implemented in appropriate combination with the other embodiments.

Embodiment 2

In this embodiment, transistors using the CAAC oxide material described in Embodiment 1 is described with reference to FIGS. 3A and 3B, FIGS. 4A and 4B, FIGS. 5A to 5F, FIGS. 6A to 6D, FIGS. 7A and 7B, FIGS. 8A to 8F, and FIGS. 9A to 9C.

Figure 3A:
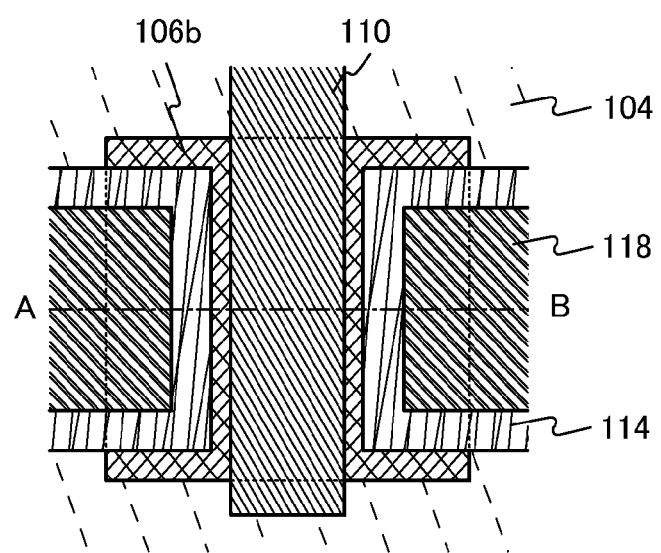
FIGS. 3A and 3B are a top view and a cross-sectional view illustrating an example of a semiconductor device according to one embodiment of the present invention.
Figure 3B:
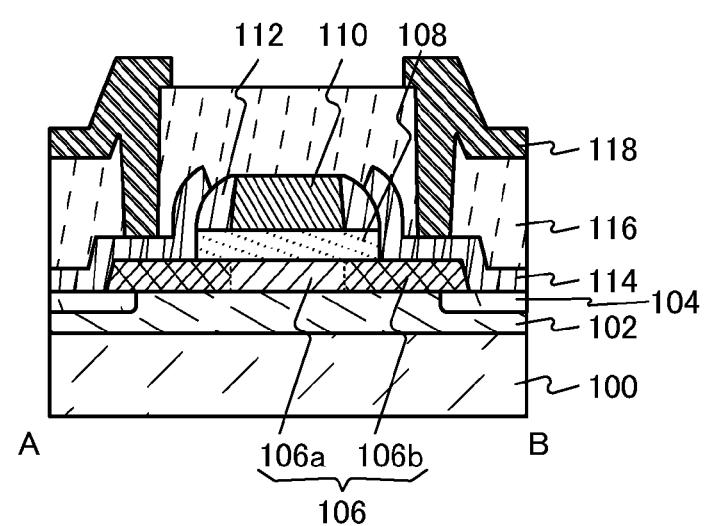

FIGS. 3A and 3B are a top view and a cross-sectional view of a transistor having a top-gate top-contact structure. FIG. 3A is the top view of the transistor and FIG. 3B shows a cross-section A-B taken along a dashed-dotted line A-B in FIG. 3A.

The transistor illustrated in FIG. 3B includes a base insulating film 102 provided over a substrate 100, a protective insulating film 104 provided in the periphery of the base insulating film 102, an oxide semiconductor film 106 which includes a high-resistance region 106a and low-resistance regions 106b and which is provided over the base insulating film 102 and the protective insulating film 104, a gate insulating film 108 provided over the oxide semiconductor film 106, a gate electrode 110 provided so as to overlap with the high-resistance region 106a with the gate insulating film 108 interposed therebetween, sidewall insulating films 112 which are in contact with side surfaces of the gate electrode 110, and a pair of electrodes 114 which are in contact with at least the low-resistance regions 106b and the sidewall insulating films 112. The transistor may include an interlayer insulating film 116 which is provided so as to cover the transistor, and wirings 118 connected to the pair of electrodes 114 through opening portions provided in the interlayer insulating film 116.

Here, the CAAC oxide film described in Embodiment 1 is used for the oxide semiconductor film 106. When the CAAC oxide film described in Embodiment 1 is used for the oxide semiconductor film 106, a transistor with high field-effect mobility and high reliability can be obtained.

In the transistor illustrated in FIG. 3B, the low-resistance regions 106b of the oxide semiconductor film 106 can be formed in a self-aligned manner with the use of the gate electrode 110 as a mask. Accordingly, a photolithography process for the low-resistance regions 106b (and the high-resistance region 106a which is formed at the same time as the low-resistance regions 106b) can be omitted. Further, since there is substantially no overlap between the low-resistance region 106b and the gate electrode 110, parasitic capacitance due to an overlap between the low-resistance region 106b and the gate electrode 110 is not generated, so that the transistor can operate at high speed. Note that in the high-resistance region 106a, a channel is formed when voltage higher than or equal to the threshold voltage of the transistor is applied to the gate.

The transistor illustrated in FIG. 3B includes the sidewall insulating films 112; accordingly, when the transistor operates, an electric field is applied from the pair of electrodes 114 to the high-resistance region 106a through the low-resistance regions 106b. The low-resistance regions 106b relax the concentration of an electric field in an edge portion of the high-resistance region 106a, so that deterioration such as hot carrier degradation can be suppressed even in a minute transistor with a short channel length, which can make the transistor highly reliable.

For the base insulating film 102, an insulating film from which oxygen is released by heat treatment is preferably used. When a film that is in contact with the oxide semiconductor film 106 is an insulating film from which oxygen is released by heat treatment, oxygen deficiency generated in the oxide semiconductor film 106 and in the vicinity of the interface of the oxide semiconductor film 106 can be repaired and deterioration in electrical characteristics of the transistor can be suppressed.

For easier crystal growth in the oxide semiconductor film 106, it is preferable that the base insulating film 102 be sufficiently flat. Specifically, the base insulating film 102 is provided so as to have an average surface roughness ($R_a$) of 1 nm or less, preferably 0.3 nm or less. Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by Expression 1.

$$Ra = \frac{1}{S_0} \int_{y1}^{y2} \int_{x1}^{x2} |f(x, y) - Z_0| \, dx \, dy \quad \text{[Expression 1]}$$

Note that in Expression 1, $S_0$ represents the area of a measurement surface (a rectangular region defined by four points represented by the coordinates $(x_1,y_1)$, $(x_1,y_2)$, $(x_2,y_1)$, and $(x_2,y_2)$), and $Z_0$ represents average height of the measurement surface. Further, $R_a$ can be measured with an atomic force microscope (AFM).

The base insulating film 102 may be formed to have a single-layer structure or a stacked-layer structure, using at least one of silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

To release oxygen by heat treatment means that the released amount of oxygen which is converted into oxygen atoms is estimated to be greater than or equal to $1.0 \times 10^{18}$ atoms/cm$^3$, or greater than or equal to $3.0 \times 10^{20}$ atoms/cm$^3$ in thermal desorption spectroscopy (TDS).

Here, a method for measuring the amount of released oxygen using TDS analysis is described.

The total amount of released gases in TDS analysis is proportional to the integral value of intensity of ions of the released gases, and the total amount of released gases can be calculated by the comparison between the integral value of a measured sample and that of a standard sample.

For example, the number of released oxygen molecules ($N_{O2}$) from an insulating film can be found according to Expression 2 with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. $CH_3OH$, which is a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either, because the proportion of such a molecule in the natural world is minimal.

$$N_{O2} = \frac{N_{H2}}{S_{H2}} \times S_{O2} \times \alpha \quad \text{[Expression 2]}$$

$N_{H2}$ is the value obtained by conversion of the number of hydrogen molecules released from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Refer to Japanese Published Patent Application No. H6-275697 for details of Expression 2. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen converted into oxygen atoms is twice the number of the released oxygen molecules.

In the above structure, the film from which oxygen is released by heat treatment may be oxygen-excess silicon oxide ($SiO_x$ (X>2)). In the oxygen-excess silicon oxide ($SiO_x$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film 102 to the oxide semiconductor film 106, the density of interface states between the oxide semiconductor film 106 and the base insulating film 102 can be reduced. As a result, carrier trapping at the interface between the oxide semiconductor film 106 and the base insulating film 102 through operation of the transistor or the like can be suppressed, and thus a transistor whose electrical characteristics less deteriorate can be obtained.

Further, in some cases, electric charge is generated owing to oxygen deficiency in the oxide semiconductor film 106. In general, part of oxygen deficiency in an oxide semiconductor film serves as a donor to release an electron which is a carrier. As a result, the threshold voltage of the transistor shifts in the negative direction. In view of this, when oxygen is sufficiently supplied from the base insulating film 102 to the oxide semiconductor film 106, oxygen deficiency in the oxide semiconductor film 106 which causes the negative shift of the threshold voltage can be reduced.

It is preferable that the protective insulating film 104 be a film through which oxygen does not pass even when heat treatment at a temperature higher than or equal to 250° C. and lower than or equal to 450° C., preferably higher than or equal to 150° C. and lower than or equal to 800° C. is performed for one hour, for example.

When the protective insulating film 104 with such a property is provided in the periphery of the base insulating film 102, oxygen released from the base insulating film 102 by heat treatment can be inhibited from diffusing toward the outside of the transistor. Accordingly, oxygen is kept in the base insulating film 102, so that the electrical characteristics and reliability of the transistor can be improved.

Note that a structure without the protective insulating film 104 is not excluded.

The protective insulating film 104 may be formed to have a single-layer structure or a stacked-layer structure, using at least one of silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

A flexible substrate may be used as the substrate 100. In that case, a transistor is formed directly on the flexible substrate. As a method for forming a transistor on a flexible substrate, a method may be employed in which after the transistor is formed over a non-flexible substrate, the transistor is separated and transferred to the substrate 100 that is a flexible substrate. In that case, a separation layer is preferably provided between the non-flexible substrate and the transistor.

The gate electrode 110 may be formed to have a single-layer structure or a stacked-layer structure, using at least one of the following materials: one of Al, Ti, Cr, Co, Ni, Cu, Y, Zr, Mo, Ag, Ta, and W; a nitride of any of these elements; an oxide of any of these elements; and an alloy of any of these elements. Note that the CAAC oxide film described in Embodiment 1 may be used.

The gate insulating film 108 can be formed using a method and a material similar to those of the base insulating film 102.

The pair of electrodes 114 can be formed using a method and a material similar to those of the gate electrode 110.

The interlayer insulating film 116 can be formed using a method and a material similar to those of the base insulating film 102.

The wirings 118 can be formed using a method and a material similar to those of the gate electrode 110.

An example of a method for manufacturing the transistor illustrated in FIG. 3B is described below.

Here, it is preferable that impurities such as hydrogen and water that adversely affect the characteristics of the transistor be not contained in all the films. For example, impurities adhering to a surface of the substrate 100 or the like are taken in a film. It is thus preferable that impurities adhering to the surface of the substrate 100 or the like be removed by performing heat treatment in a reduced-pressure atmosphere or an oxidizing atmosphere before formation of each film. In addition, since impurities existing in a film formation chamber become a problem, the impurities are also preferably removed in advance. Specifically, it is preferable that the film formation chamber be subjected to baking so that removal of a gas from the inside of the film formation chamber is promoted and the film formation chamber is evacuated. In addition, before formation of each film (or after exposure of the film formation chamber to the air), approximately five-minute dummy film formation for approximately 100 dummy substrates is preferably performed. Note that it is more preferable that the film formation chamber be evacuated every time dummy film formation for a dummy substrate is performed. Here, dummy film formation means film formation conducted on a dummy substrate by sputtering or the like. Through dummy film formation, a film is deposited on a dummy substrate and the inner wall of the film formation chamber, so that impurities in the film formation chamber and an adsorbate existing on the inner wall of the film formation chamber can be enclosed in the film. For the dummy substrate, a material from which a less amount of gas is released is preferably used, and for example, a material which is similar to that of the substrate 100 may be used. By performing dummy film formation, impurity concentration in a film to be formed can be reduced.

Since the purity of a gas used for film formation also influences the impurity concentration in the film, the purity of the gas is preferably as high as possible. When a sputtering method is employed, for example, an argon gas having a purity of 9N (dew point: −121° C., water concentration: 0.1 ppb, hydrogen concentration: 0.5 ppb) and an oxygen gas having a purity of 8N (dew point: −112° C., water concentration: 1 ppb, hydrogen concentration: 1 ppb) can be used.

Figure 5A:
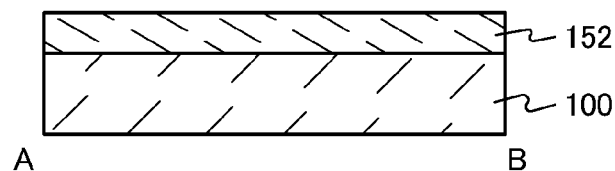
FIGS. 5A to 5F are cross-sectional views illustrating a method for manufacturing a semiconductor device according to one embodiment of the present invention.

First, a base insulating film 152 is formed over the substrate 100 by a sputtering method, an evaporation method, a PCVD method, a PLD method, an ALD method, an MBE method, or the like using a material selected from the materials given for the base insulating film 102 (see FIG. 5A).

Figure 5B:
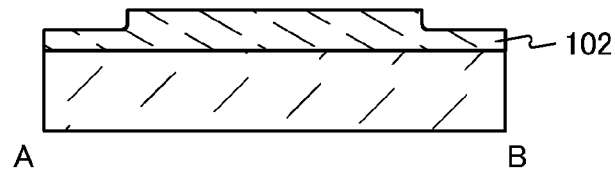

Then, the base insulating film 152 is processed by photolithography or the like, so that the base insulating film 102 is formed (see FIG. 5B).

Figure 5C:
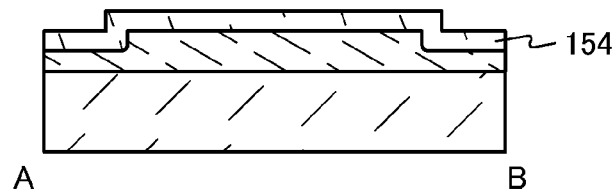

After that, a protective insulating film 154 is formed by a sputtering method, an evaporation method, a PCVD method, a PLD method, an ALD method, an MBE method, or the like using a material selected from the materials given for the protective insulating film 104 (see FIG. 5C).

Figure 5D:
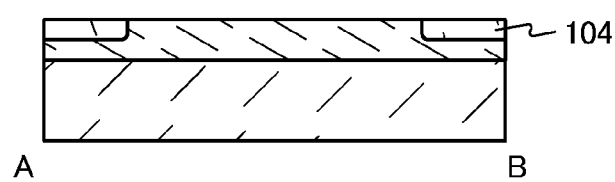

Then, by chemical mechanical polishing (CMP) treatment, the protective insulating film 104 whose top surface is level with that of the base insulating film 102 is formed (see FIG. 5D). Note that the top surface of the base insulating film 102 and that of the protective insulating film 104 may be at substantially the same level.

Figure 5E:
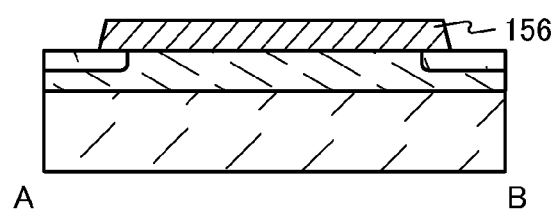

Then, an oxide semiconductor film is formed by a method similar to that for the oxide film which is described in Embodiment 1, and is processed by photolithography or the like, so that an oxide semiconductor film 156 is formed (see FIG. 5E). By heat treatment which is performed at this time, oxygen is supplied from the base insulating film 102 to the oxide semiconductor film.

Figure 5F:
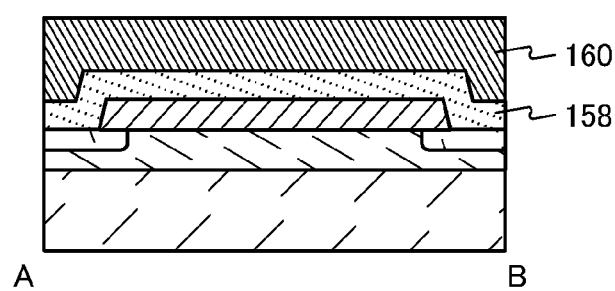

After that, an insulating film 158 and a conductive film 160 are formed in this order (see FIG. 5F). As a method for forming these films, any of a sputtering method, an evaporation method, a PCVD method, a PLD method, an ALD method, an MBE method, and the like can be employed. The insulating film 158 and the conductive film 160 can be respectively formed using a material selected from the materials given for the gate insulating film 108 and a material selected from the materials given for the gate electrode 110.

Figure 6A:
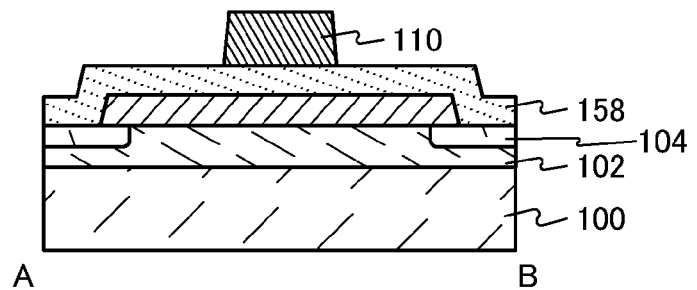
FIGS. 6A to 6D are cross-sectional views illustrating a method for manufacturing a semiconductor device according to one embodiment of the present invention.

Then, the conductive film 160 is processed by photolithography or the like, so that the gate electrode 110 is formed (see FIG. 6A).

Figure 6B:
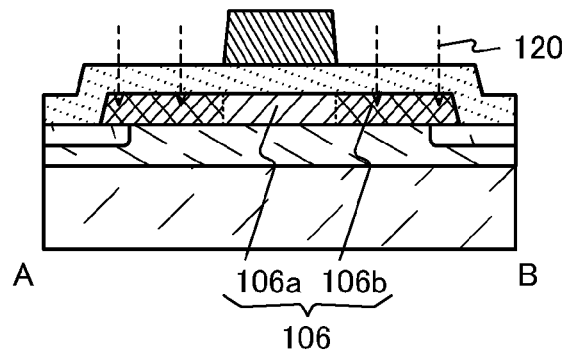

After that, with the use of the gate electrode 110 as a mask, an impurity 120 for reducing the resistance of the oxide semiconductor film 156 is added through the insulating film 158, so that the oxide semiconductor film 106 including the high-resistance region 106a and the low-resistance regions 106b is formed (see FIG. 6B). Note that phosphorus, nitrogen, boron, or the like can be used as the impurity 120. After addition of the impurity 120, heat treatment at a temperature higher than or equal to 250° C. and lower than or equal to 650° C. may be performed. Note that the impurity 120 is preferably added by an ion implantation method because, in such a case, less hydrogen is added into the oxide semiconductor film 106 as compared to the case where the impurity 120 is added by an ion doping method. Note that the use of an ion doping method is not excluded.

Note that by addition of the impurity 120 through the insulating film 158, damage caused at the time of addition of the impurity 120 to the oxide semiconductor film 106 can be reduced.

Figure 6C:
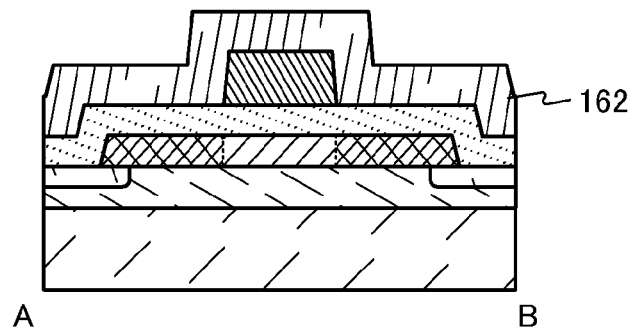

After that, an insulating film 162 is formed by a sputtering method, an evaporation method, a PCVD method, a PLD method, an ALD method, an MBE method, or the like using a material selected from the materials given for the sidewall insulating films 112 (see FIG. 6C).

Then, the insulating film 162 is etched, so that the sidewall insulating films 112 are formed. The etching here is a highly anisotropic etching step, and the sidewall insulating films 112 can be formed in a self-aligned manner by performing the highly anisotropic etching step on the insulating film 162. Here, dry etching is preferably employed as highly anisotropic etching, and a gas including fluorine such as trifluoromethane ($CHF_3$), octafluorocyclobutane ($C_4F_8$), or tetrafluoromethane ($CF_4$) can be used as an etching gas. A rare gas such as helium (He) or argon (Ar) or hydrogen ($H_2$) may be added to the etching gas. In addition, as the dry etching, a reactive ion etching (RIE) method in which high-frequency voltage is applied to a substrate, is preferably used.

Figure 6D:
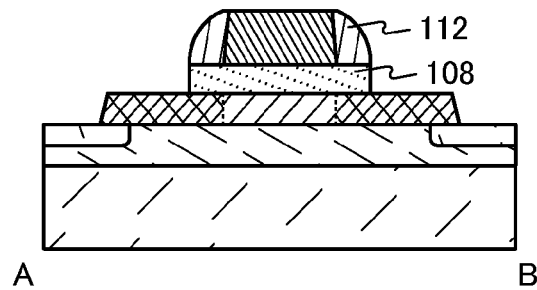

While the sidewall insulating films 112 are formed, the gate insulating film 108 can be formed by processing the insulating film 158 (see FIG. 6D).

Figure 7A:
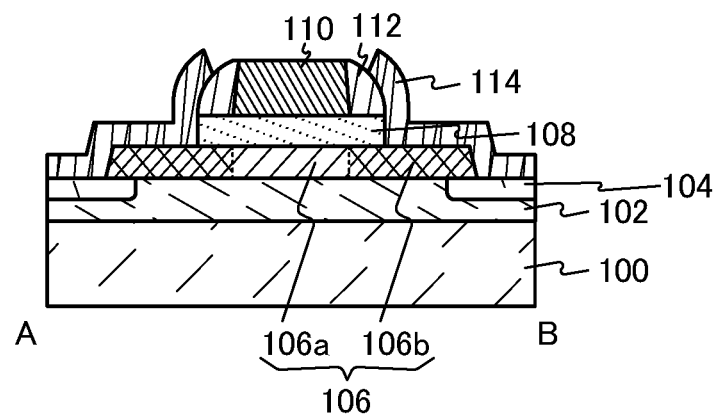
FIGS. 7A and 7B are cross-sectional views illustrating a method for manufacturing a semiconductor device according to one embodiment of the present invention.
Figure 7B:
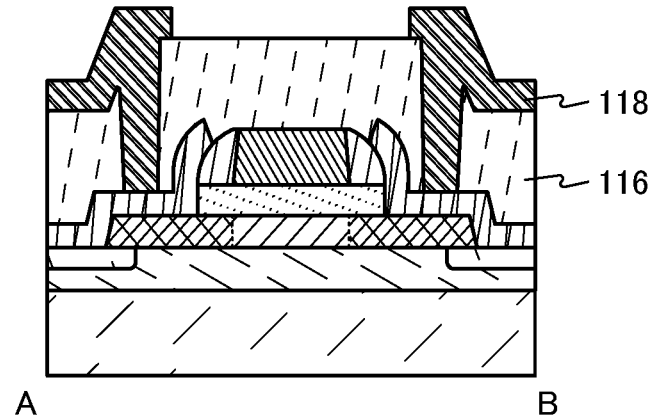

After that, a conductive film is formed by a sputtering method, an evaporation method, a PCVD method, a PLD method, an ALD method, an MBE method, or the like and processed by photolithography or the like, so that the pair of electrodes 114 are formed (see FIG. 7A).

Then, the interlayer insulating film 116 is formed by a sputtering method, an evaporation method, a PCVD method, a PLD method, an ALD method, an MBE method, or the like, and the opening portions for exposure of the pair of electrodes 114 are provided. After that, a conductive film is formed by a sputtering method, an evaporation method, a PCVD method, a PLD method, an ALD method, an MBE method, or the like and processed by photolithography or the like, so that the wirings 118 which are in contact with the pair of electrodes 114 are formed (see FIG. 7B). Note that for the interlayer insulating film 116, it is preferable to use an aluminum oxide film at least part of which has a thickness of 20 nm or more, preferably 50 nm or more, more preferably 100 nm or more. When an aluminum oxide film is used, entry of impurities (e.g., hydrogen or water) from the outside of the transistor, which adversely affect the electrical characteristics of the transistor, can be suppressed. Further, outward diffusion of oxygen released from the base insulating film 102 from the transistor can be suppressed. To achieve these effects, although depending on the quality of the aluminum oxide film, the aluminum oxide film needs to have some thickness. However, making the thickness of an aluminum oxide film too large leads a reduction in productivity; thus, an appropriate thickness may be selected.

Through the above-described steps, the transistor illustrated in FIG. 3B can be manufactured.

Figure 4A:
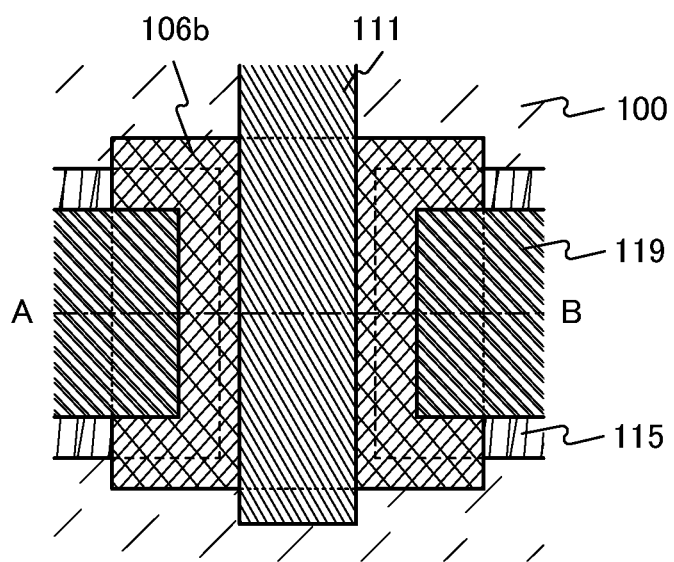
FIGS. 4A and 4B are a top view and a cross-sectional view illustrating an example of a semiconductor device according to one embodiment of the present invention.
Figure 4B:
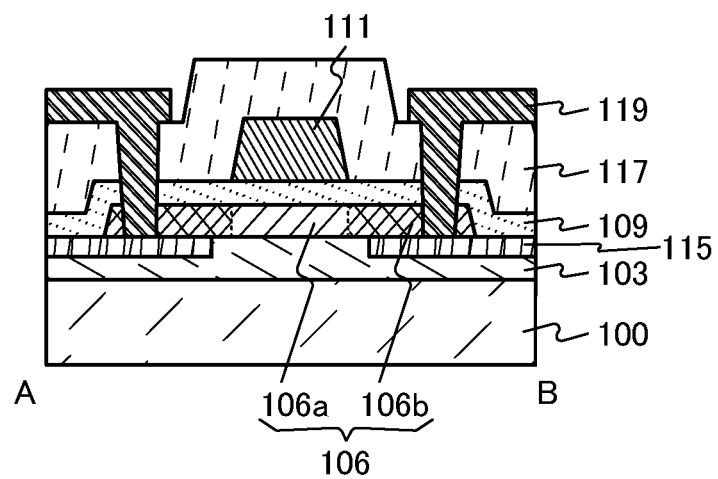

FIGS. 4A and 4B are a top view and a cross-sectional view of a transistor having a top-gate bottom-contact structure. FIG. 4A is the top view of the transistor and FIG. 4B shows a cross-section A-B taken along a dashed-dotted line A-B in FIG. 4A.

The transistor illustrated in FIG. 4B includes a base insulating film 103 provided over the substrate 100, a pair of electrodes 115 provided in groove portions of the base insulating film 103, the oxide semiconductor film 106 which includes the high-resistance region 106a and the low-resistance regions 106b and which is provided over the base insulating film 103 and the pair of electrodes 115, a gate insulating film 109 provided over the oxide semiconductor film 106, a gate electrode 111 provided so as to overlap with the high-resistance region 106a with the gate insulating film 109 interposed therebetween. The transistor may include an interlayer insulating film 117 which is provided so as to cover the transistor, and wirings 119 connected to the pair of electrodes 115 through opening portions provided in the interlayer insulating film 117, the gate insulating film 109, and the oxide semiconductor film 106.

Note that the base insulating film 103, the gate insulating film 109, the gate electrode 111, the pair of electrodes 115, the interlayer insulating film 117, and the wirings 119 can be respectively formed using methods and materials similar to those of the base insulating film 102, the gate insulating film 108, the gate electrode 110, the pair of electrodes 114, the interlayer insulating film 116, and the wirings 118.

The transistor illustrated in FIG. 4B is different from the transistor illustrated in FIG. 3B in that the pair of electrodes 115 are in contact with lower portions of the oxide semiconductor film 106. This structure is preferable in the case where the oxide semiconductor film 106 is formed thin (e.g., in the case where the oxide semiconductor film 106 is formed to a thickness of 5 nm or less) or the like, because part of the oxide semiconductor film 106 is not exposed to plasma or a chemical solution at the time of formation of the pair of electrodes 115.

An example of a method for manufacturing the transistor illustrated in FIG. 4B is described below.

Figure 8A:
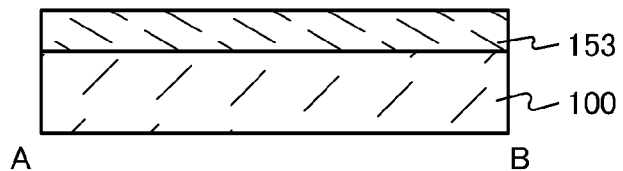
FIGS. 8A to 8F are cross-sectional views illustrating a method for manufacturing a semiconductor device according to one embodiment of the present invention.

First, a base insulating film 153 is formed over the substrate 100 (see FIG. 8A).

Figure 8B:
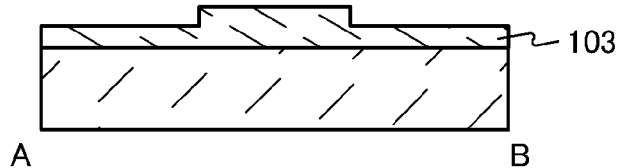

After that, the base insulating film 153 is processed, so that the base insulating film 103 is formed (see FIG. 8B).

Figure 8C:
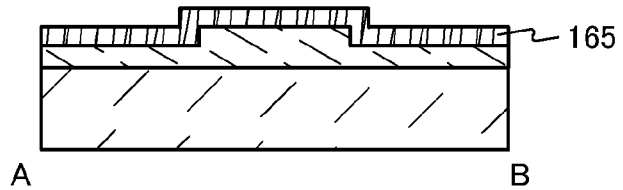

Then, a conductive film 165 is formed (see FIG. 8C).

Figure 8D:
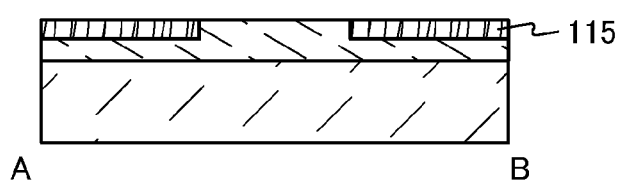

Then, CMP treatment is performed, so that the pair of electrodes 115 whose top surfaces are level with that of the base insulating film 103 are formed (see FIG. 8D).

Figure 8E:
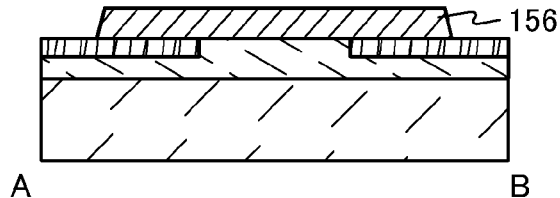

After that, the oxide semiconductor film 156 is formed (see FIG. 8E).

Figure 8F:
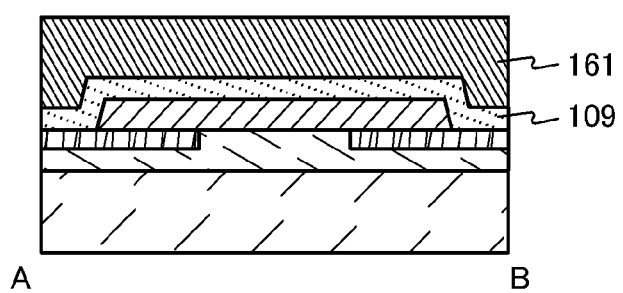

Then, the gate insulating film 109 and a conductive film 161 are formed in this order (see FIG. 8F).

Figure 9A:
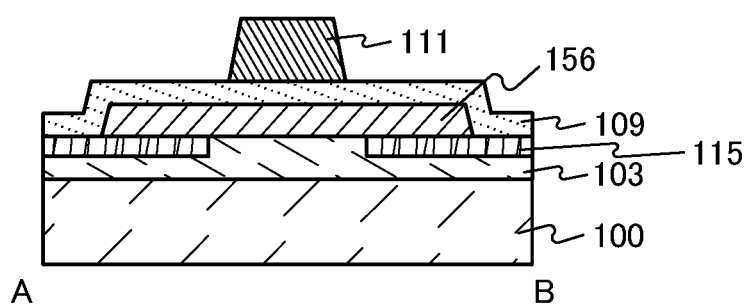
FIGS. 9A to 9C are cross-sectional views illustrating a method for manufacturing a semiconductor device according to one embodiment of the present invention.

Then, the conductive film 161 is processed, so that the gate electrode 111 is formed (see FIG. 9A).

Figure 9B:
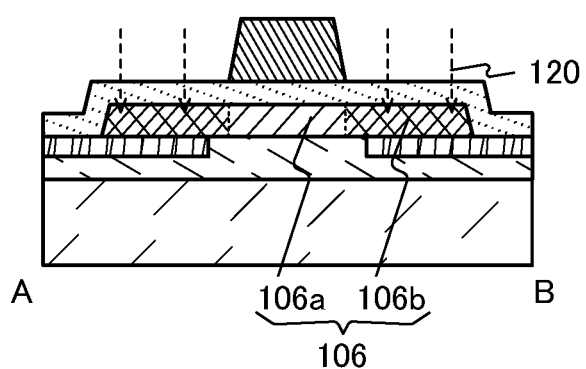
Figure 9C:
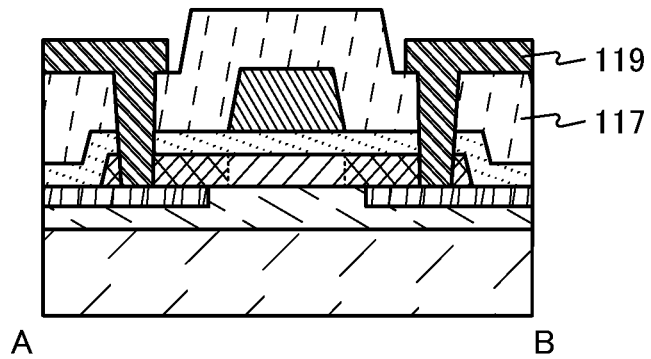

After that, with the use of the gate electrode 111 as a mask, the impurity 120 for reducing the resistance of the oxide semiconductor film 156 is added through the gate insulating film 109, so that the oxide semiconductor film 106 including the high-resistance region 106a and the low-resistance regions 106b is formed (see FIG. 9B).

After that, the interlayer insulating film 117 is formed and the opening portions for exposure of the pair of electrodes 115 are provided. Then, a conductive film is formed and processed, so that the wirings 119 which are in contact with the pair of electrodes 115 are formed (see FIG. 9C).

Through the above-described steps, the transistor illustrated in FIG. 4B can be manufactured.

In this embodiment, a transistor with high field-effect mobility and high reliability can be obtained by using the CAAC oxide material described in Embodiment 1 for the oxide semiconductor film 106.

This embodiment can be implemented in appropriate combination with the other embodiments.

Embodiment 3

In this embodiment, a liquid crystal display device manufactured using the transistor described in Embodiment 2 will be described. Note that although an example in which one embodiment of the present invention is applied to the liquid crystal display device is described in this embodiment, application is not limited thereto. For example, application of one embodiment of the present invention to an electroluminescence (EL) display device is readily conceived by those skilled in the art.

Figure 10:
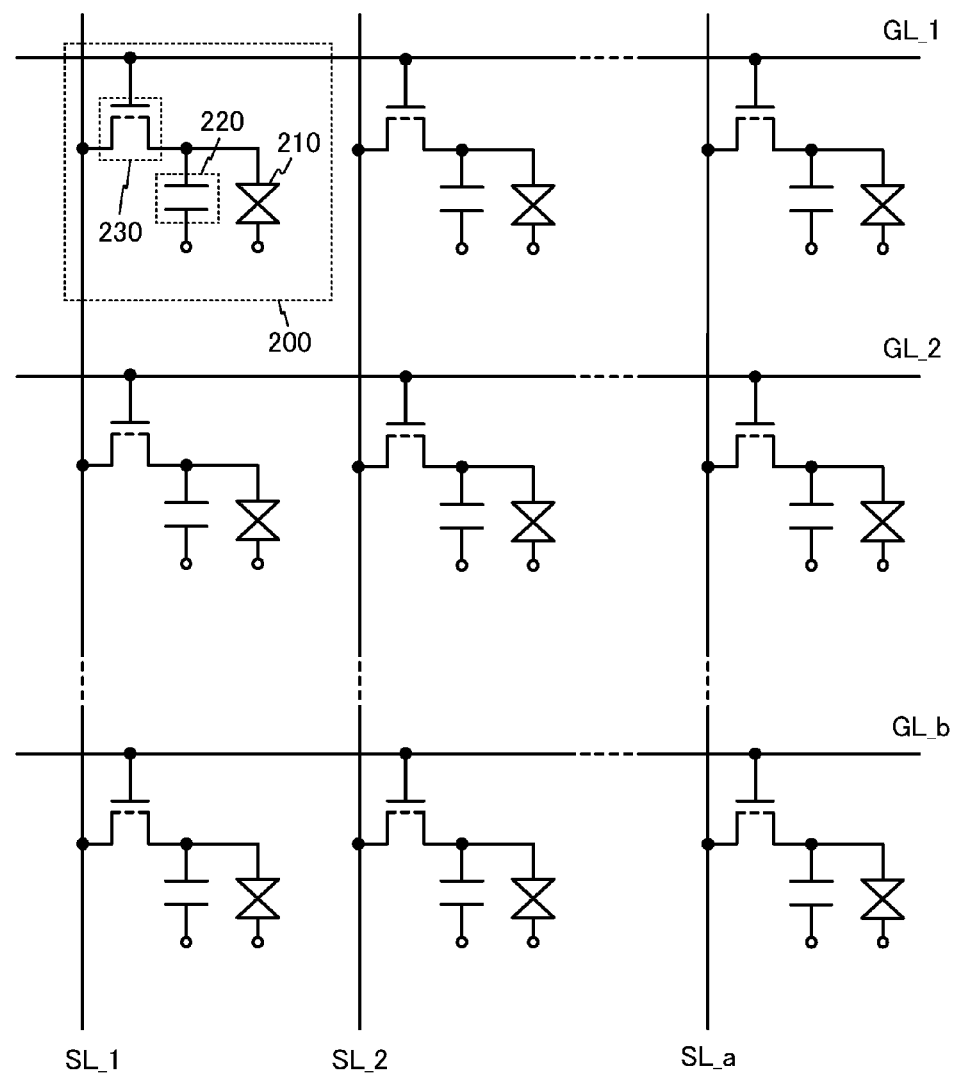
FIG. 10 is a circuit diagram illustrating an example of a liquid crystal display device according to one embodiment of the present invention.

FIG. 10 is a circuit diagram of an active matrix liquid crystal display device. The liquid crystal display device includes source lines SL_1 to SL_a, gate lines GL_1 to GL_b, and a plurality of pixels 200. Each pixel 200 includes a transistor 230, a capacitor 220, and a liquid crystal element 210. A pixel portion in the liquid crystal display device is constituted by arranging the pixels 200 in a matrix. In the case where the source line or the gate line is simply mentioned, it is denoted as the source line SL or the gate line GL.

As the transistor 230, the transistor described in Embodiment 2 can be used. With the use of the transistor described in Embodiment 2, a liquid crystal display device with low power consumption, favorable electrical characteristics, and high reliability can be obtained. Note that in order to distinguish transistors using oxide semiconductors from the other transistors, the symbol denoting the transistor 230 is used.

The gate line GL is connected to a gate of the transistor 230, the source line SL is connected to a source of the transistor 230, and a drain of the transistor 230 is connected to one capacitor electrode of the capacitor 220 and one pixel electrode of the liquid crystal element 210. The other capacitor electrode of the capacitor 220 and the other pixel electrode of the liquid crystal element 210 are connected to a common electrode. Note that the common electrode may be formed using the same material and in the same layer as the gate line GL.

Further, the gate line GL is connected to a gate driver circuit. The gate driver circuit may include the transistor described in Embodiment 2. The off-state current of the transistor can be decreased, and the voltage used for turning the transistor on can be low. Thus, power consumption can be reduced.

Further, the source line SL is connected to a source driver circuit. The source driver circuit may include the transistor described in Embodiment 2. The off-state current of the transistor can be decreased, and the voltage used for turning the transistor on can be low. Thus, power consumption can be reduced.

One of or both the gate driver circuit and the source driver circuit may be formed over a substrate which is separately prepared, and connected by a method such as a chip on glass (COG) method, a wire bonding method, or a tape automated bonding (TAB) method may be employed.

Since the transistor is easily broken by static electricity or the like, a protection circuit is preferably provided. The protection circuit is preferably formed using a nonlinear element.

When a potential is applied to the gate line GL to be higher than or equal to the threshold voltage of the transistor 230, electric charge supplied from the source line SL flows as a drain current of the transistor 230 and is stored in the capacitor 220. After charging for one row is performed, the transistors 230 in the row are turned off, and the voltage is not applied from the source line SL. However, the necessary voltage can be held by the electric charge stored in the capacitor 220. Then, the capacitors 220 in the next row are charged. In such a manner, charging for the first row to the b-th row is performed.

Since the off-state current of the transistor 230 is small, the electric charge stored in the capacitor 220 is barely likely to be discharged, and capacitance of the capacitor 220 can be reduced, so that power consumption needed for charging can be reduced.

Further, in the case where a transistor whose off-state current is small (such as the transistor described in Embodiment 2) is used as the transistor 230, a time period during which the voltage is held can be made longer. By this effect, the frequency of rewriting display can be reduced in the case of an image with little motion (including a still image); thus, a further reduction in power consumption can be achieved.

In addition, capacitance of the capacitor 220 can be further reduced, so that power consumption needed for charging can be reduced.

As described above, with the use of the transistor according to one embodiment of the present invention, a liquid crystal display device with high reliability and low power consumption can be obtained.

This embodiment can be implemented in appropriate combination with the other embodiments.

Embodiment 4

In this embodiment, an example of manufacturing a semiconductor memory device using the transistor described in Embodiment 2 will be described.

Typical examples of volatile semiconductor memory devices include a dynamic random access memory (DRAM) which stores data by selecting a transistor included in a memory element and storing electric charge in a capacitor and a static random access memory (SRAM) which holds stored data using a circuit such as a flip-flop.

Typical examples of nonvolatile semiconductor memory devices include a flash memory which has a floating gate between a gate electrode and a channel formation region of a transistor and stores data by holding electric charge in the floating gate.

The transistor described in Embodiment 2 can be applied to some of transistors included in the above semiconductor memory device.

First, a memory cell that is a semiconductor memory device to which the transistor described in Embodiment 2 is applied is described with reference to FIGS. 11A and 11B.

Figure 11A:
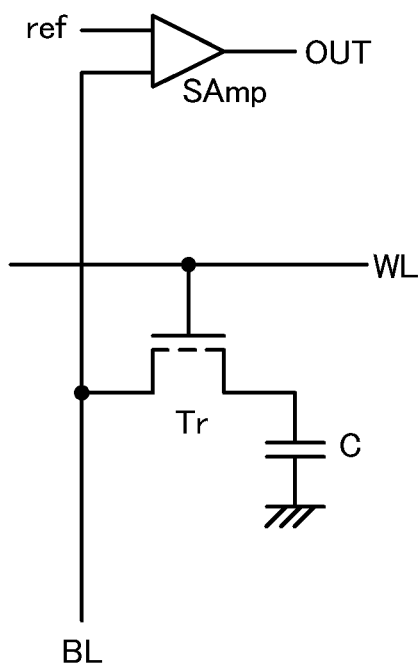
FIG. 11A is a circuit diagram illustrating an example of a semiconductor memory device according to one embodiment of the present invention and FIG. 11B shows electrical characteristics thereof.

A memory cell includes a bit line BL, a word line WL, a sense amplifier SAmp, a transistor Tr, and a capacitor C (see FIG. 11A).

Figure 11B:
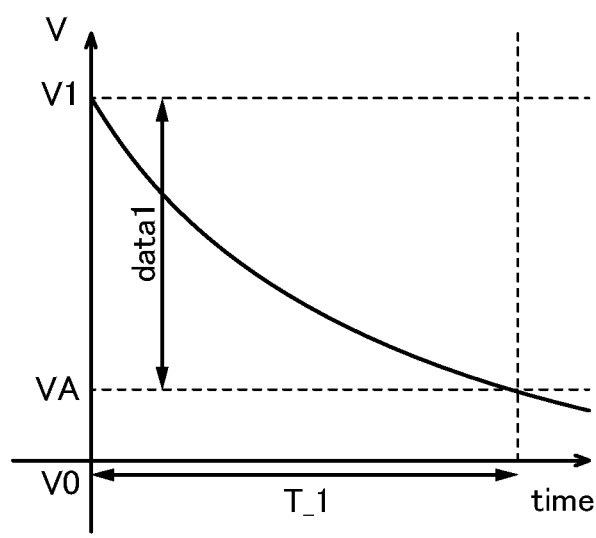

It is known that the potential held by the capacitor C is gradually reduced over time due to the off-state current of the transistor Tr as shown in FIG. 11B. After a certain period of time, the potential originally charged from V0 to V1 is decreased to VA which is a limit for reading data 1. This period is called a holding period T_1. In the case of a two-level memory cell, refresh operation needs to be performed within the holding period T_1.

When the transistor described in Embodiment 2 is employed as the transistor Tr, the holding period T_1 can be made longer because the off-state current of the transistor is small. That is, frequency of the refresh operation can be reduced, which results in a reduction in power consumption.

When the transistor whose off-state current is small is used as the transistor Tr, the time period for holding the voltage can further be prolonged, so that the power consumption can be further reduced. For example, when a memory cell includes the transistor described in Embodiment 2 whose off-state current is less than or equal to $1 \times 10^{-21}$ A, preferably less than or equal to $1 \times 10^{-24}$ A, data can be held for several days to several decades without supply of power.

As described above, according to one embodiment of the present invention, a semiconductor memory device with high reliability and low power consumption can be obtained.

Next, a memory cell that is a semiconductor memory device to which the transistor described in Embodiment 2 is applied and which is different from that illustrated in FIGS. 11A and 11B is described with reference to FIGS. 12A and 12B.

Figure 12A:
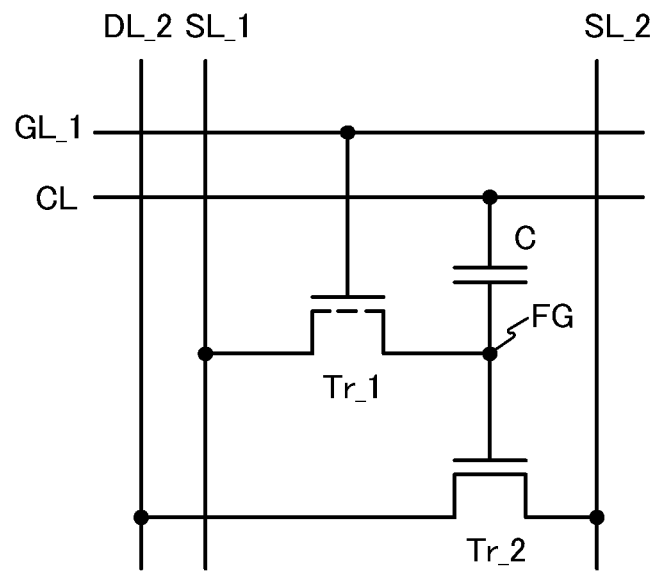
FIG. 12A is a circuit diagram illustrating an example of a semiconductor memory device according to one embodiment of the present invention and FIG. 12B shows electrical characteristics thereof.

FIG. 12A is a circuit diagram of a memory cell. The memory cell includes a transistor Tr_1, a gate line GL_1 connected to a gate of the transistor Tr_1, a source line SL_1 connected to a source of the transistor T_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a floating gate FG connected to the other terminal of the capacitor C, a drain of the transistor T_1, and a gate of the transistor Tr_2.

Figure 12B:
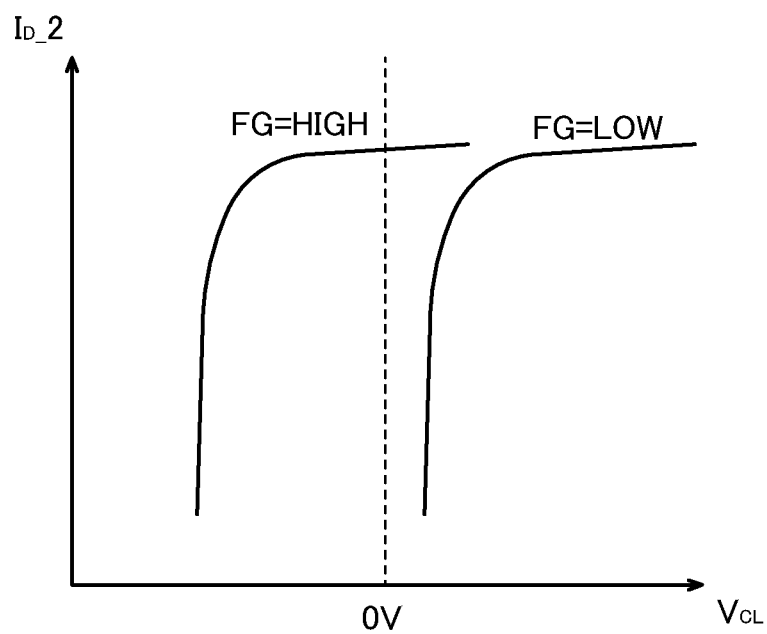

The memory cell described in this embodiment utilizes variation in the threshold voltage of the transistor Tr_2, which depends on the potential of the floating gate FG For example, FIG. 12B is a graph showing a relationship between a drain current ID_2 flowing through the transistor Tr_2 and a potential $V_{CL}$ of the capacitor line CL.

The floating gate FG can control a potential through the transistor T_1. For example, the potential of the source line SL_1 is set to VDD. In this case, when the potential of the gate line GL_1 is set to be higher than or equal to the potential obtained by adding VDD to the threshold voltage Vth of the transistor T_1, the potential of the floating gate FG can be HIGH. Further, when the potential of the gate line GL_1 is set to be lower than or equal to the threshold voltage Vth of the transistor T_1, the potential of the floating gate FG can be LOW.

Thus, either a $V_{CL}$-$I_{D\_2}$ curve (FG=LOW) or a $V_{CL}$-ID_2 curve (FG=HIGH) can be obtained. In the case where FG=LOW, the drain current ID_2 is small when $V_{CL}$ is 0 V, so that data 0 is given. In the case where FG=HIGH, the drain current ID_2 is large when $V_{CL}$ is 0 V, so that data 1 is given. In such a manner, data can be stored.

By applying the transistor described in Embodiment 2 to the transistor Tr_1, the off-state current of the transistor can be extremely small; thus, the electric charge stored in the floating gate FG can be inhibited from being unintentionally leaked through the transistor T_1. As a result, data can be held for a long time.

Note that the transistor described in Embodiment 2 can be applied to the transistor Tr_2.

As described above, according to one embodiment of the present invention, a semiconductor memory device with high reliability for a long time and low power consumption can be obtained.

This embodiment can be implemented in appropriate combination with the other embodiments.

Embodiment 5

In this embodiment, examples of electronic devices to which any of Embodiments 2 to 4 is applied will be described.

Figure 13A:
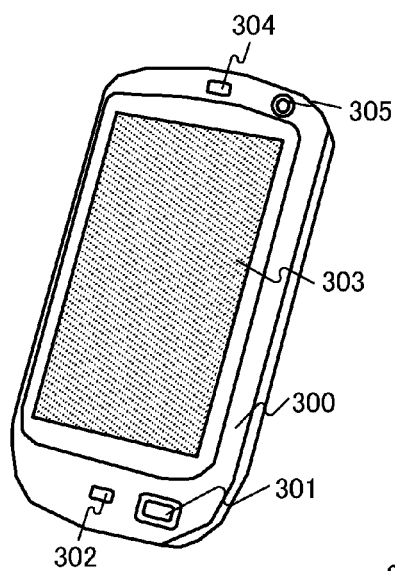
FIGS. 13A to 13C are perspective views each illustrating an example of an electronic device to which a semiconductor device according to one embodiment of the present invention is applied.

FIG. 13A illustrates a portable information terminal. The portable information terminal includes a housing 300, a button 301, a microphone 302, a display portion 303, a speaker 304, and a camera 305, and may have a function as a mobile phone. The display device described in Embodiment 3 can be applied to the display portion 303 and the camera 305. Although not illustrated, the semiconductor memory device described in Embodiment 4 can also be applied to an arithmetic unit, a wireless circuit, or a memory device inside the housing 300.

Figure 13B:
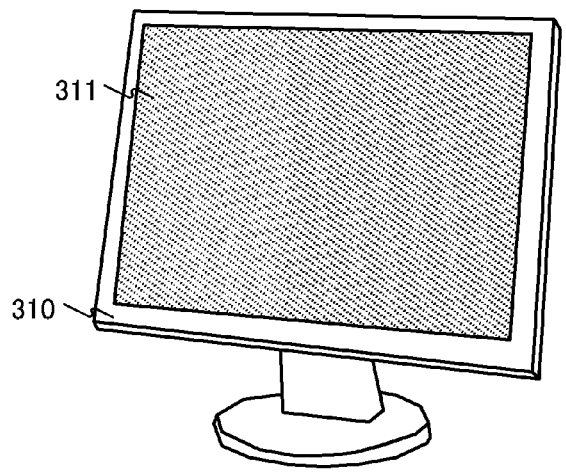

FIG. 13B illustrates a display which includes a housing 310 and a display portion 311. A display device according to Embodiment 3 can be applied to the display portion 311. When a transistor according to one embodiment of the present invention is used, the display can have low power consumption and high display quality even in the case where the size of the display portion 311 is increased.

Figure 13C:
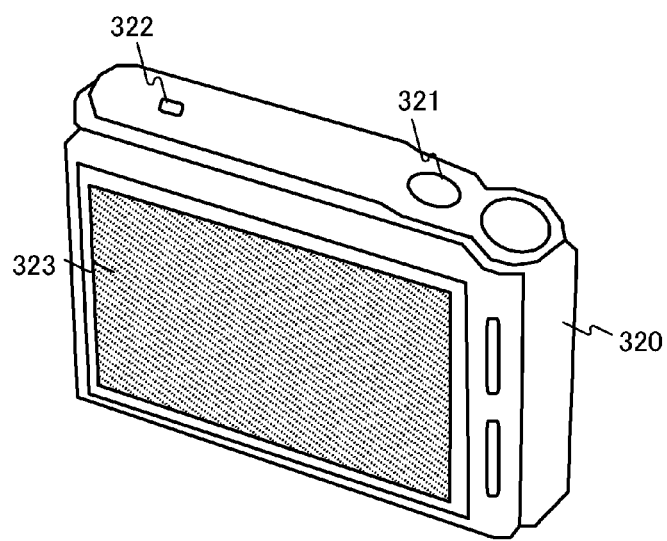

FIG. 13C illustrates a digital still camera which includes a housing 320, a button 321, a microphone 322, and a display portion 323. The display device described in Embodiment 3 can be applied to the display portion 323. Although not illustrated, the semiconductor memory device described in Embodiment 4 can also be applied to a memory circuit or an image sensor which is included in the housing 320.

With the use of a semiconductor device according to one embodiment of the present invention, a high performance electronic device with low power consumption can be provided.

This embodiment can be implemented in appropriate combination with the other embodiments.

This application is based on Japanese Patent Application serial no. 2011-096611 filed with Japan Patent Office on Apr. 22, 2011, the entire contents of which are hereby incorporated by reference.

What is claimed is:

1. A method for manufacturing a semiconductor device comprising:
   forming an oxide semiconductor film over a substrate by a sputtering method using a target,
   wherein an atomic ratio of indium is more than or equal to twice as compared to tin in the target,
   wherein an atomic ratio of zinc is more than or equal to triple as compared to tin in the target,
   wherein the oxide semiconductor film comprises indium, tin and zinc,
   wherein the oxide semiconductor film is not a single crystal oxide semiconductor film,
   wherein the oxide semiconductor film comprises crystalline portions of which c-axes are aligned substantially perpendicular to a surface of the oxide semiconductor film, and
   wherein a substrate temperature is higher than or equal to 150° C. and lower than or equal to 450° C. at the time of forming the oxide semiconductor film.

2. The method for manufacturing the semiconductor device according to claim 1, wherein zinc is contained at 50 atomic % or more in the target.

3. The method for manufacturing the semiconductor device according to claim 1, wherein a composition ratio of indium:tin:zinc is 2:1:3 (atomic ratio) in the oxide semiconductor film.

4. The method for manufacturing the semiconductor device according to claim 1, wherein a composition ratio of indium:tin:zinc is 2:1:4 (atomic ratio) in the oxide semiconductor film.

5. The method for manufacturing the semiconductor device according to claim 1, wherein a composition ratio of indium:tin:zinc is 36.5:15:48.5 (atomic ratio) in the oxide semiconductor film.

6. The method for manufacturing the semiconductor device according to claim 1, wherein the crystalline portions are different from each other in a direction of an a-axis or a direction of a b-axis in an a-b plane.

7. The method for manufacturing the semiconductor device according to claim 1, further comprising a pair of electrodes at least part of which is in contact with the oxide semiconductor film.

8. The method for manufacturing the semiconductor device according to claim 1, further comprising a step of forming a second oxide semiconductor film over the oxide semiconductor film.

9. A method for manufacturing a semiconductor device comprising:
   forming an insulating film over a substrate; and
   forming an oxide semiconductor film over the insulating film by a sputtering method using a target,
   wherein an atomic ratio of indium is more than or equal to twice as compared to tin in the target,
   wherein an atomic ratio of zinc is more than or equal to triple as compared to tin in the target,
   wherein the oxide semiconductor film comprises indium, tin and zinc,
   wherein the oxide semiconductor film is not a single crystal oxide semiconductor film,
   wherein the oxide semiconductor film comprises crystalline portions of which c-axes are aligned substantially perpendicular to a surface of the oxide semiconductor film, and
   wherein a substrate temperature is higher than or equal to 150° C. and lower than or equal to 450° C. at the time of forming the oxide semiconductor film.

10. The method for manufacturing the semiconductor device according to claim 9, wherein zinc is contained at 50 atomic % or more in the target.

11. The method for manufacturing the semiconductor device according to claim 9, wherein a composition ratio of indium:tin:zinc is 2:1:3 (atomic ratio) in the oxide semiconductor film.

12. The method for manufacturing the semiconductor device according to claim 9, wherein a composition ratio of indium:tin:zinc is 2:1:4 (atomic ratio) in the oxide semiconductor film.

13. The method for manufacturing the semiconductor device according to claim 9, wherein a composition ratio of indium:tin:zinc is 36.5:15:48.5 (atomic ratio) in the oxide semiconductor film.

14. The method for manufacturing the semiconductor device according to claim 9, wherein the crystalline portions are different from each other in a direction of an a-axis or a direction of a b-axis in an a-b plane.

15. The method for manufacturing the semiconductor device according to claim 9, further comprising a pair of electrodes at least part of which is in contact with the oxide semiconductor film.

16. The method for manufacturing the semiconductor device according to claim 9, further comprising a step of forming a second oxide semiconductor film over the oxide semiconductor film.

17. The method for manufacturing the semiconductor device according to claim 9, wherein the insulating film is silicon oxide.

18. The method for manufacturing the semiconductor device according to claim 9, wherein the insulating film is formed by a sputtering method or a PCVD method.

* * * * *